(12) United States Patent
Chen et al.

(10) Patent No.: US 12,274,030 B2
(45) Date of Patent: Apr. 8, 2025

(54) HEAT DISSIPATION DEVICE

(71) Applicant: AURAS TECHNOLOGY CO., LTD., New Taipei (TW)

(72) Inventors: Chih-Wei Chen, New Taipei (TW); Cheng-Ju Chang, New Taipei (TW); Chung-Chien Su, New Taipei (TW); Hsiang-Chih Chuang, New Taipei (TW); Jyun-Wei Huang, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 198 days.

(21) Appl. No.: 18/107,039

(22) Filed: Feb. 8, 2023

(65) Prior Publication Data

US 2023/0269908 A1 Aug. 24, 2023

Related U.S. Application Data

(60) Provisional application No. 63/311,490, filed on Feb. 18, 2022.

(51) Int. Cl.
*H05K 7/20* (2006.01)
*G06F 1/20* (2006.01)

(52) U.S. Cl.
CPC ......... *H05K 7/20336* (2013.01); *G06F 1/206* (2013.01); *H05K 7/20318* (2013.01); *H05K 7/2039* (2013.01)

(58) Field of Classification Search
CPC .......... H05K 7/20336; H05K 7/20318; H05K 7/2039; H05K 7/20409; H05K 7/20327;
(Continued)

(56) References Cited

U.S. PATENT DOCUMENTS 7,370,693 B2 * 5/2008 Lin .................. F28D 15/0275
  165/104.33
7,965,511 B2 * 6/2011 Refai-Ahmed ..... F28D 15/0275
  174/15.1
(Continued)

FOREIGN PATENT DOCUMENTS

JP 2000180080 A * 6/2000 ........... F28D 1/0226

OTHER PUBLICATIONS

Yamanaka Shunichi; Kameda Kazue; Kaitani Yuichi, "Heat Pipe Type Radiator", Jun. 30, 2000, Calsonic Kansei Corp, Entire Document (Translation of JP 2000180080). (Year: 2000).*

*Primary Examiner* — Stephen S Sul
(74) *Attorney, Agent, or Firm* — Amin, Turocy & Watson, LLP (57) ABSTRACT

A heat dissipation device includes a vapor chamber for contacting a heat source; at least one heat pipe having a first end and a second end connected to the vapor chamber; at least one partition disposed inside the heat pipe to partition the inside of the heat pipe into a first channel and a second channel isolated from each other; and a heat dissipation fin set disposed on the vapor chamber and partially covers the heat pipe. The vapor chamber is filled with a liquid working medium that absorbs the heat of the heat source and then gasifies into a gaseous working medium. The gaseous working medium moves into the first channel and the second channel to be condensed by the heat dissipation fin set, so the gaseous working medium is liquefied into the liquid working medium, and then the liquid working medium flows back into the vapor chamber.

15 Claims, 9 Drawing Sheets

(58) Field of Classification Search
CPC ......... G06F 1/206; G06F 1/20; H01L 23/427; Y02D 10/00; F28D 15/02; F28F 2215/06
See application file for complete search history.

(56) References Cited

U.S. PATENT DOCUMENTS

| | | | |
|---|---|---|---|
| 8,919,427 B2* | 12/2014 | Wang | H01L 23/427 |
| | | | 165/104.21 |
| 10,598,441 B2* | 3/2020 | Kawabata | H01L 23/427 |
| 10,663,231 B2* | 5/2020 | Tan | H01L 23/3736 |
| 2009/0223651 A1* | 9/2009 | Meyer, IV | H01L 23/427 |
| | | | 165/104.19 |
| 2015/0282381 A1* | 10/2015 | Yampolsky | H05K 7/20127 |
| | | | 165/185 |
| 2017/0153066 A1* | 6/2017 | Lin | F28D 15/046 |
| 2020/0068745 A1* | 2/2020 | Lin | H05K 7/20336 |
| 2020/0370837 A1* | 11/2020 | Liu | F28D 15/0275 |
| 2021/0327785 A1* | 10/2021 | Lin | F28D 15/0275 |
| 2022/0354019 A1* | 11/2022 | Tsai | H01L 23/467 |
| 2023/0013442 A1* | 1/2023 | Lan | F28D 15/0233 |

* cited by examiner

HEAT DISSIPATION DEVICE

BACKGROUND

1. Technical Field

The present disclosure relates to the field of heat dissipation, and more particularly, to a heat dissipation device using a vapor chamber.

2. Description of Related Art

In response to modernization requirements, computers and various electronic devices are developing rapidly and their performance is constantly improving. However, in the process, heat dissipation problems caused by high-performance hardware also follow. Generally speaking, computers and various electronic devices usually use heat dissipation elements to dissipate heat, for example, use heat dissipation paste or heat sinks to attach to electronic elements to be dissipated, so as to absorb and dissipate heat. However, the effect of this heat dissipation method is limited, so a heat dissipation element using phase change of the working fluid to boost heat conduction has been developed.

The above-mentioned heat dissipation elements achieve the purpose of heat transfer via the phase change and flow direction of the working fluid, but such heat dissipation elements still cannot maintain an effective and consistent heat dissipation when faced with a large amount of heat energy generated by a high-power processor, resulting in poor overall heat dissipation efficiency.

Therefore, how to provide a heat dissipation device that can solve the above-mentioned problems is one of the problems to be overcome urgently in the industry.

SUMMARY

The present disclosure provides a heat dissipation device, comprising: a vapor chamber in contact with a heat source and having a chamber formed in the vapor chamber; at least one heat pipe having a first end and a second end, wherein the first end and the second end are communicated with the vapor chamber; at least one partition disposed in the heat pipe and partitioning an inside of the heat pipe into a first channel and a second channel isolated from each other; and a heat dissipation fin set disposed on the vapor chamber and partially covering the heat pipe, wherein the chamber is filled with a liquid working medium, and the liquid working medium absorbs heat of the heat source and then gasifies into a gaseous working medium, and the gaseous working medium moves into the first channel and the second channel to be condensed by the heat dissipation fin set, such that the gaseous working medium is liquefied into the liquid working medium, and then the liquid working medium flows back into the chamber.

In the aforementioned heat dissipation device, space of the first channel at the first end is larger than space of the second channel at the first end, and the space of the first channel at the second end is smaller than the space of the second channel at the second end.

In the aforementioned heat dissipation device, the gaseous working medium in the chamber enters the heat pipe from the first channel at the first end and the second channel at the second end, and the liquid working medium in the heat pipe enters the chamber from the second channel at the first end and the first channel at the second end.

In the aforementioned heat dissipation device, the first channel has a radial cross-sectional area gradually decreasing from the first end to the second end, and the second channel has a radial cross-sectional area gradually decreasing from the second end to the first end.

In the aforementioned heat dissipation device, the heat pipe comprises two bent portions and a middle portion, and the two bent portions are respectively erected on the vapor chamber and ends of the two bent portions are bent, and two ends of the middle portion are respectively connected to the ends of the two bent portions, such that the middle portion is disposed between the two bent portions.

In the aforementioned heat dissipation device, the heat dissipation fin set comprises a first fin set and two second fin sets, the two second fin sets are respectively disposed at two ends of the vapor chamber and respectively have at least one recess for accommodating the two bent portions, and the first fin set is disposed between the two second fin sets and corresponding to a position of the middle portion.

In the aforementioned heat dissipation device, fin heights of the two second fin sets are higher than fin heights of the first fin set.

In the aforementioned heat dissipation device, the middle portion is disposed above the first fin set and superficially attached to a top of the first fin set.

In the aforementioned heat dissipation device, a portion of the partition located in the middle portion is closer to a top of the first fin set and parallel to the middle portion, such that space of the first channel at the middle portion is smaller than space of the second channel at the middle portion.

In the aforementioned heat dissipation device, an extending direction of fins of the first fin set and the two second fin sets is perpendicular to an extending direction of the middle portion.

In the aforementioned heat dissipation device, a number of the heat pipes is two and the two heat pipes are parallel to each other, a number of the partitions is two, and a number of the recesses in each of the two second fin sets is two.

In the aforementioned heat dissipation device, a cross-sectional shape of the middle portion comprises rectangle, square, triangle, trapezoid, circle, or semicircle.

In the aforementioned heat dissipation device, the present disclosure further comprises a base on which the vapor chamber is disposed, the base having an opening, wherein the vapor chamber further comprises a heat absorbing portion protruding from the opening and in direct contact with the heat source.

In the aforementioned heat dissipation device, the heat source is a processor, and the base and the vapor chamber are disposed on a circuit board around the processor via a plurality of locking members and two fasteners, such that the processor is in direct contact with the heat absorbing portion.

In the aforementioned heat dissipation device, the partition is in a shape of a flat plate.

In the aforementioned heat dissipation device, the heat pipe has the same material as the partition and is integrally formed with the partition.

By virtue of the heat dissipation device of the present disclosure comprising the vapor chamber, the heat pipes, the partitions and the heat dissipation fin sets, when faced with a large amount of heat energy generated by a high-power processor, the partition can divide the heat pipe into two channels at the same time. Further, via the arrangement of the radial cross-sectional areas of the two channels gradually decreasing in opposite directions, the working medium in the channel is converted from the gaseous state to the liquid state in a single direction (that is, the direction in which the radial cross-sectional area of the channel becomes smaller), without being disturbed by other interferences to generate backflow. Therefore, the heat dissipation device of the present disclosure can provide higher heat dissipation efficiency as a whole, and can maintain effective and consistent heat dissipation.

DETAILED DESCRIPTIONS

The following describes the implementation of the present disclosure with examples. Those skilled in the art can easily understand other advantages and effects of the present disclosure from the content disclosed in this specification, and can also implement or apply them via other different specific embodiments.

Please refer to FIG. 1, FIG. 2, FIG. 3 and FIG. 4 at the same time. A heat dissipation device 1 of the present disclosure comprises a vapor chamber 11, at least one heat pipe 12 and a heat dissipation fin set 13. The vapor chamber 11 is used to contact a heat source (such as a processor 2), and a chamber 111 is formed inside the vapor chamber 11 and filled with a working medium, wherein the working medium is such as water, alcohol, methanol or acetone, etc.

The number of the heat pipes 12 can be one or multiple and can be increased or decreased according to requirements, but the present disclosure is not limited thereto. In an embodiment, two heat pipes 12 are taken as an example for illustration. Each heat pipe 12 has a first end 121 and a second end 122 respectively, and the first end 121 and the second end 122 can communicate with the vapor chamber 11 and the chamber 111 of the vapor chamber 11. For instance, four openings (not shown) may be provided on the same surface of the vapor chamber 11 for respectively connecting the first ends 121 and the second ends 122 of the two heat pipes 12, and the two heat pipes 12 are disposed on the same surface of the vapor chamber 11 in parallel with each other, but the present disclosure is not limited thereto. In addition, the heat dissipation fin set 13 can be disposed on the vapor chamber 11 and partially cover the heat pipes 12.

In an embodiment, each heat pipe 12 further includes two bent portions 123 and a middle portion 124, wherein the two bent portions 123 are in the shape of round tubes, which are respectively erected (for example, vertically disposed) on the vapor chamber 11 (such as the aforementioned openings), and ends of the bent portions 123 are bent. Further, the middle portion 124 is a rectangular tubular body whose width is greater than its height, and two ends of the middle portion 124 are respectively connected to the ends of the two bent portions 123, such that the middle portion 124 is disposed between the two bent portions 123.

In an embodiment, each heat pipe 12 is further provided with a corresponding partition 125 therein, so that the inside of the heat pipe 12 is divided into a first channel 126 and a second channel 127 which are isolated from each other, that is, the number of the partitions 125 is the same as the number of the heat pipes 12 (e.g., there are two partitions 125 in the heat dissipation device 1). The partition 125 is a flat plate and made of the same material as the heat pipe 12 (such as copper), and is fixed inside the heat pipe 12 by bonding or welding. However, in other embodiments, the partition 125 can also be integrally formed with the heat pipe 12, and the present disclosure is not limited thereto. The first channel 126, the second channel 127 and the chamber 111 have capillary structures formed by sintered particles, metal meshes, fibers, grooves, or combinations thereof.

Figure 6A:
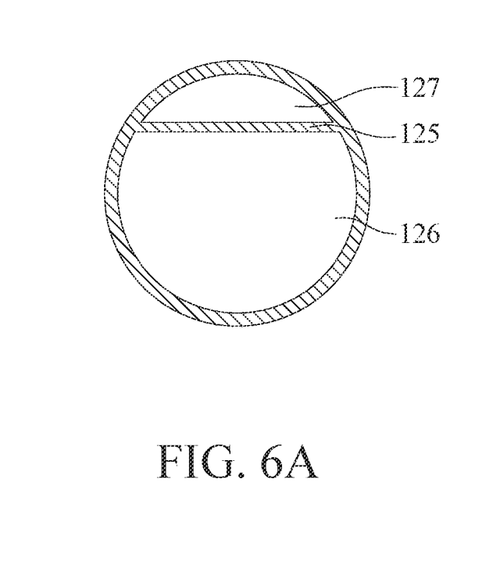
FIG. 6A is a schematic cross-sectional view of FIG. 2 along the line B-B.
Figure 6B:
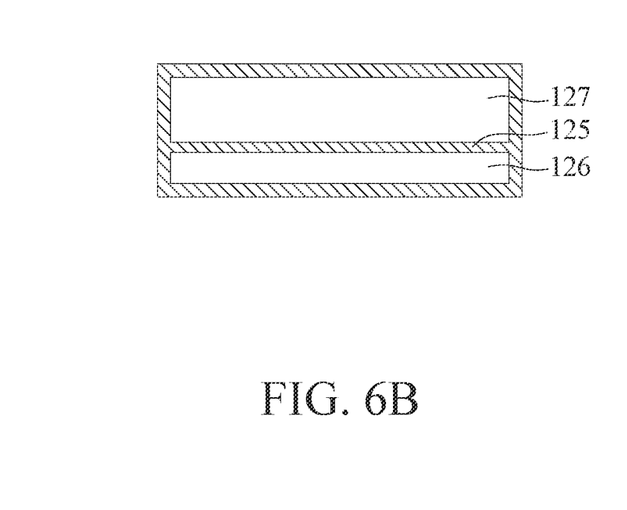
FIG. 6B is a schematic cross-sectional view of FIG. 2 along the line C-C.
Figure 6C:
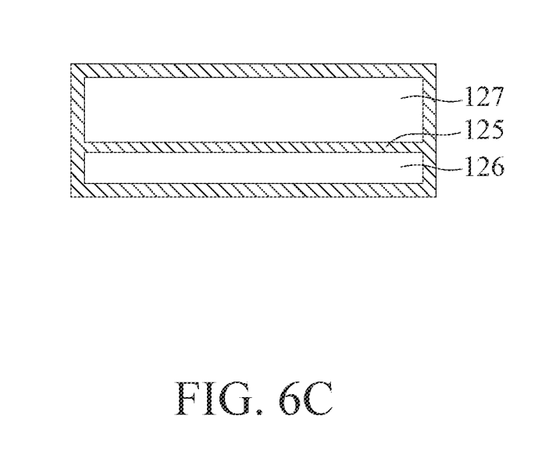
FIG. 6C is a schematic cross-sectional view of FIG. 2 along the line D-D.
Figure 6D:
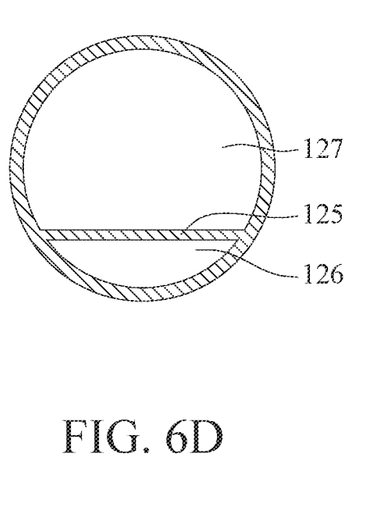
FIG. 6D is a schematic cross-sectional view of FIG. 2 along the line E-E.
Figure 7A:
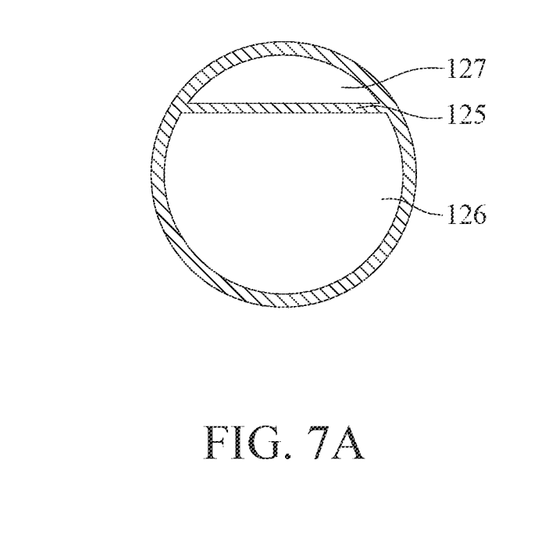
FIG. 7A to FIG. 7D are schematic cross-sectional views showing different embodiments of FIG. 6A to FIG. 6D respectively.
Figure 7B:
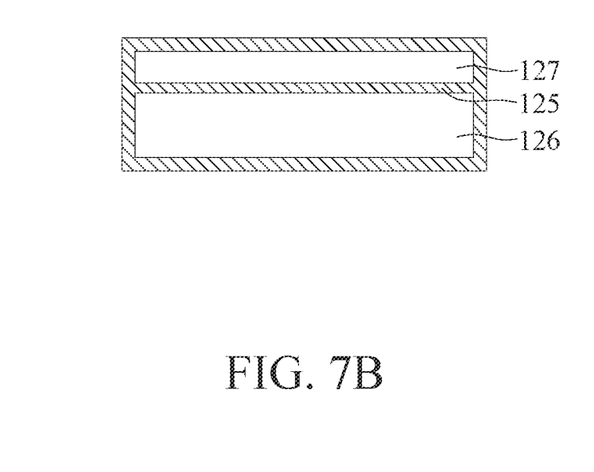
Figure 7C:
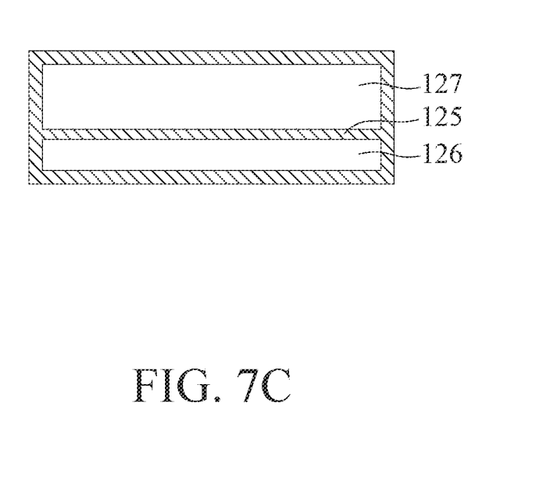
Figure 7D:
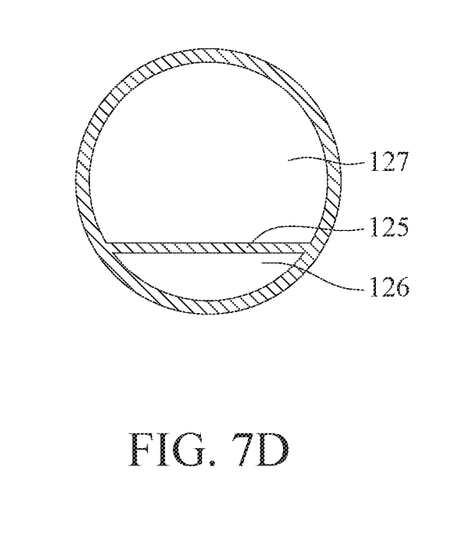

The partitions 125 are designed differently in different bent portions 123 and middle portions 124, resulting in differences in the space sizes between the first channel 126 and the second channel 127. For instance, please refer to FIG. 5A, FIG. 5B, FIG. 6A, FIG. 6B, FIG. 6C and FIG. 6D at the same time. Due to the installation position of the partition 125, the space of the first channel 126 is larger than the space of the second channel 127 in the bent portion 123 of the first end 121, that is to say, the radial cross-sectional area of the first channel 126 in the bent portion 123 of the first end 121 is larger than the radial cross-sectional area of the second channel 127 in the bent portion 123 of the first end 121 (as shown in FIG. 6A). In the other bent portion 123 at the second end 122, the space of the first channel 126 is smaller than the space of the second channel 127, that is to say, the radial cross-sectional area of the first channel 126 in the other bent portion 123 of the second end 122 is smaller than the radial cross-sectional area of the second channel 127 in the other bent portion 123 of the second end 122 (as shown in FIG. 6D). In the middle portion 124, since the partition 125 is disposed closer to the heat dissipation fin set 13 and parallel to the middle portion 124, a space where the first channel 126 is located in the middle portion 124 is smaller than a space where the second channel 127 is located in the middle portion 124, that is to say, the radial cross-sectional area of the first channel 126 in the middle portion 124 is smaller than the radial cross-sectional area of the second channel 127 in the middle portion 124 (as shown in FIG. 6B and FIG. 6C).

In the above-described embodiments, the middle portion 124 is described as an example of a rectangular tubular body having a width greater than a height, but the present disclosure is not limited thereto. The middle portion 124 can also be a square tubular body, a triangular tubular body, a trapezoidal tubular body, a circular tubular body, or a semicircular tubular body, that is, the cross-sectional shape of the middle portion 124 can also be rectangular, square, triangular, trapezoidal, circular, or semicircle.

In addition, although the above-mentioned embodiments are respectively described with the size between the space of the first channel 126 and the space of the second channel 127 located at the first end 121, the second end 122, and the middle portion 124, but the present disclosure is not limited thereto. The present disclosure can match various cross-sectional shapes of the middle portion 124 to design the position of the partition 125 (as shown in FIG. 7A to FIG. 7D), as long as the first channel 126 has a radial cross-sectional area gradually decreasing from the first end 121 to the second end 122 (sequentially from FIG. 7A, FIG. 7B, FIG. 7C to FIG. 7D), and the second channel 127 has a radial cross-sectional area gradually decreasing from the second end 122 to the first end 121 (sequentially from FIG. 7D, FIG. 7C, FIG. 7B to FIG. 7A).

Figure 1:
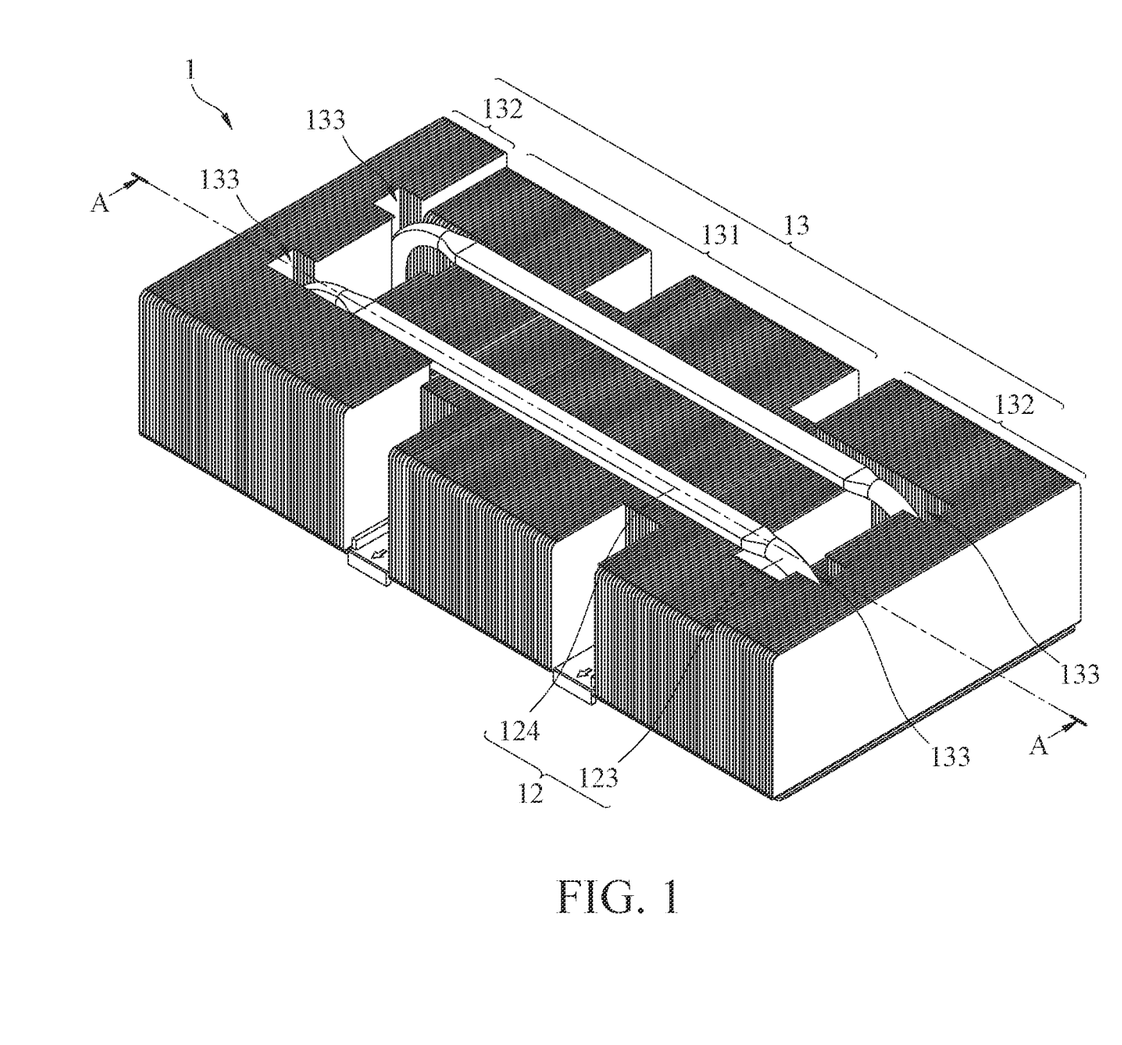
FIG. 1 is a schematic overall view of a heat dissipation device according to the present disclosure.
Figure 2:
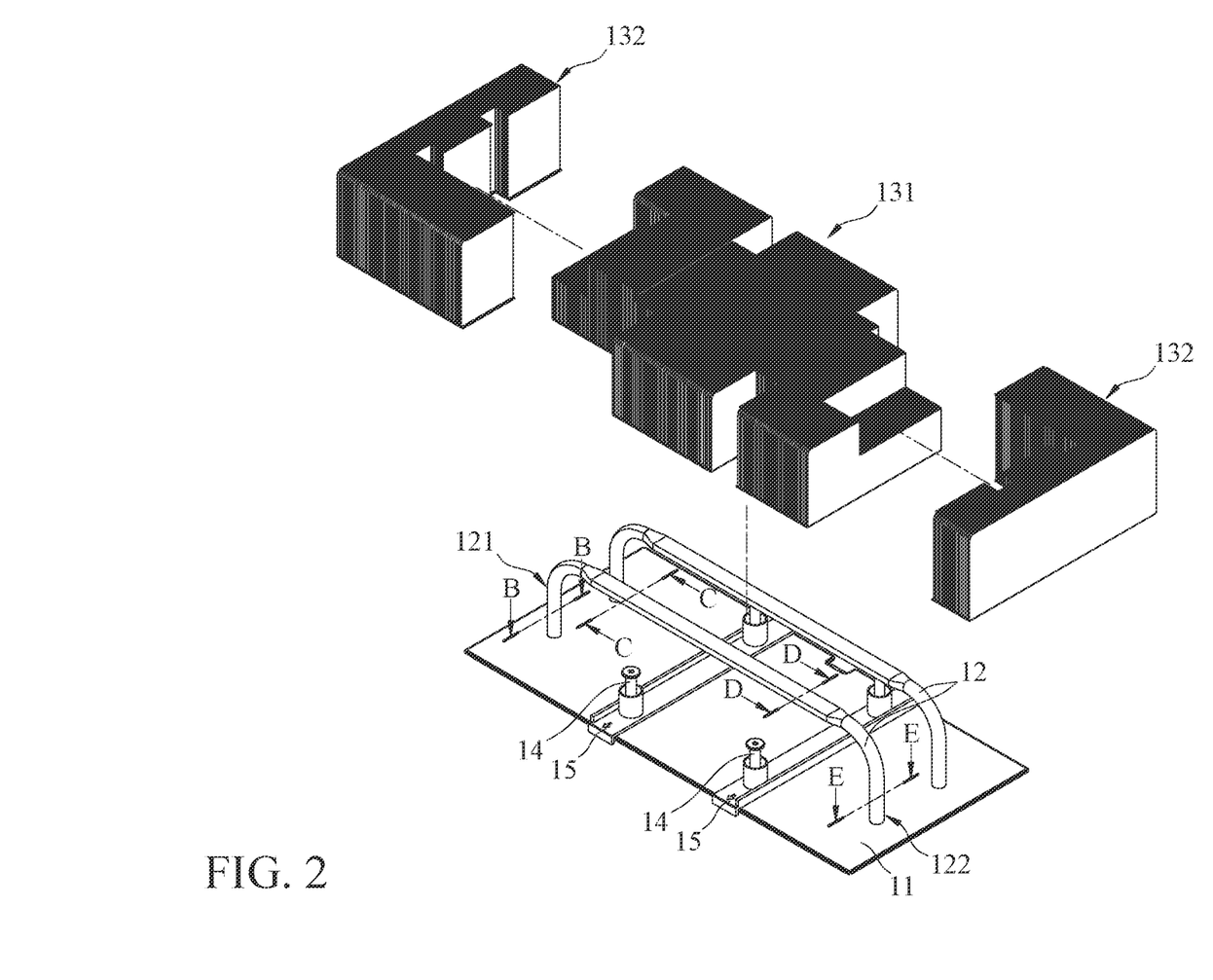
FIG. 2 is a schematic exploded view of disassembling heat dissipation fin sets in the heat dissipation device according to the present disclosure.

In an embodiment, the heat dissipation fin set 13 includes a first fin set 131 and two second fin sets 132, and both of the first fin set 131 and the second fin set 132 are composed of a plurality of fins. The two second fin sets 132 are respectively disposed at two ends of the vapor chamber 11, and the first fin set 131 is disposed between the two second fin sets 132 and corresponding to the position of the middle portion 124. In addition, each second fin set 132 has two recesses 133 for accommodating each bent portion 123 therein. In practice, the number of the recesses 133 can correspond to the number of the heat pipes 12 required, and the present disclosure is not limited to two recesses 133 for each second fin set 132.

In one embodiment, since the fin height(s) of the second fin set 132 is higher than the fin height(s) of the first fin set 131, the middle portion 124 above/on the first fin set 131 can be superficially attached to and in contact with the top of the first fin set 131 when each bent portion 123 is fully accommodated in each recess 133 of each second fin set 132. In other words, the height of the middle portion 124 itself may be equal to or smaller than the height difference between the first fin set 131 and the second fin set 132, and the shape of the top of the first fin set 131 can be designed according to the shape of the middle portion 124, so that the middle portion 124 accommodates and is superficially attached to and in contact with the top of the first fin set 131, so as to avoid the excessive gap between the middle portion 124 and the top of the first fin set 131, which results in the reduction of the heat dissipation efficiency, but the present disclosure is not limited thereto.

In one embodiment, in order to improve heat dissipation efficiency, the extending direction of the fins of the first fin set 131 and the second fin set 132 can be perpendicular to the extending direction of the middle portion 124, but the present disclosure is not limited thereto.

Figure 3:
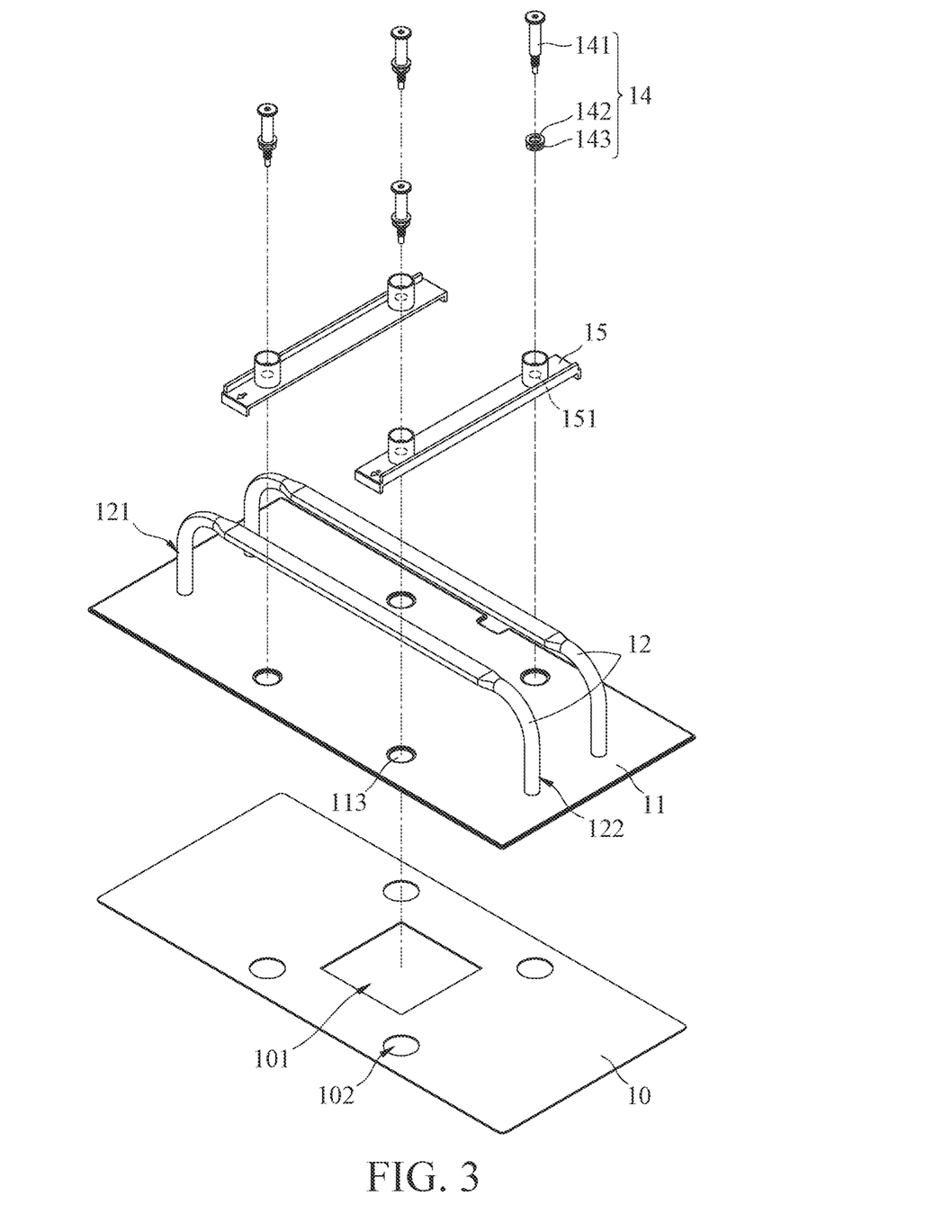
FIG. 3 is a schematic exploded view of disassembling a base, a vapor chamber, locking members and fasteners in the heat dissipation device according to the present disclosure.
Figure 4:
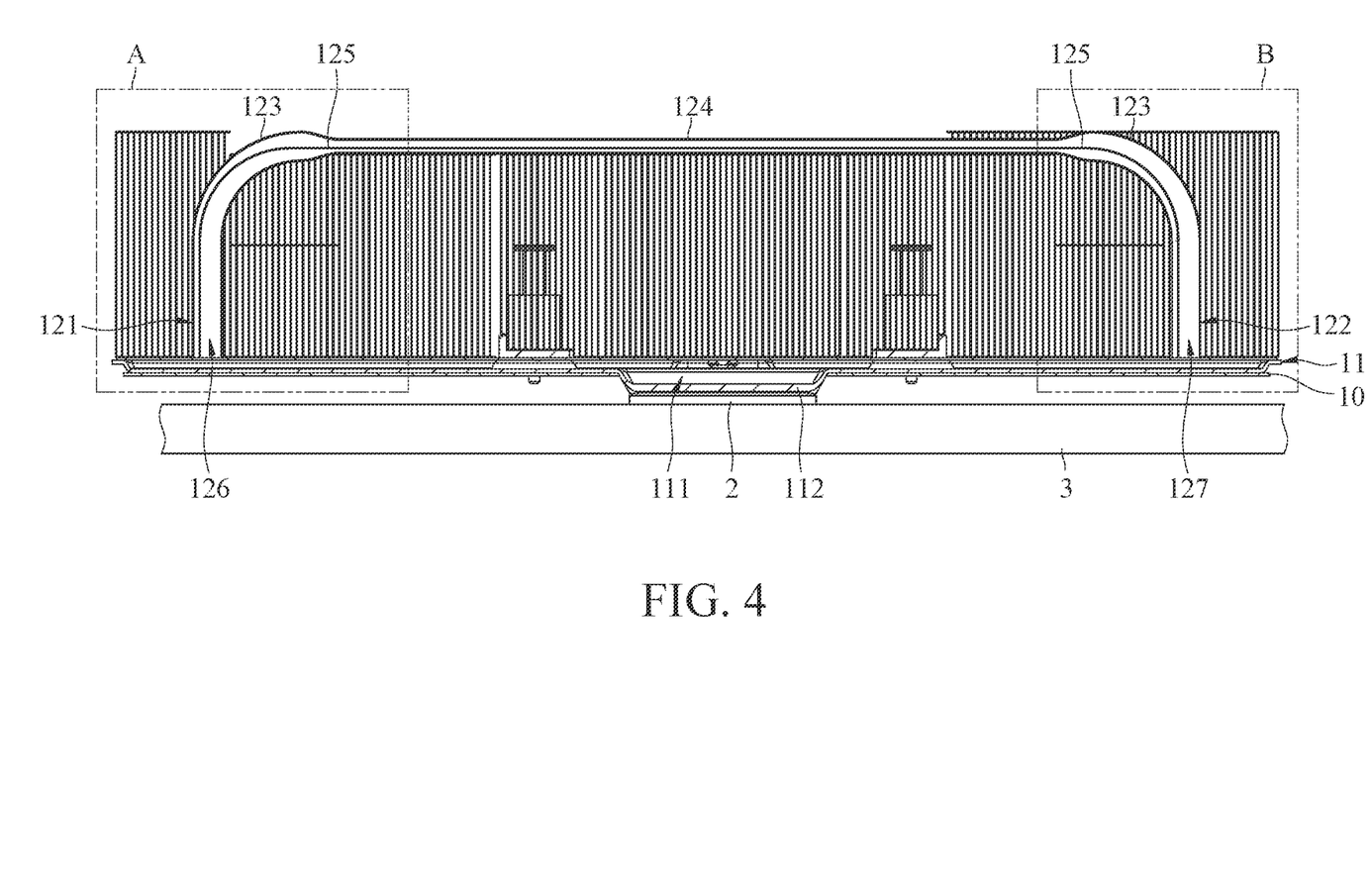
FIG. 4 is a schematic cross-sectional view of FIG. 1 along the line A-A.
Figure 5A:
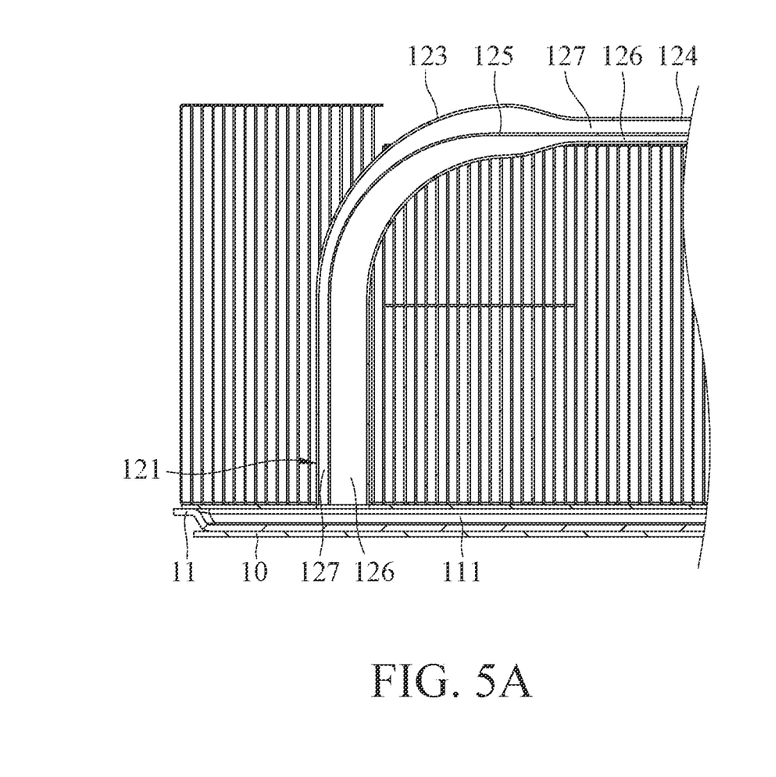
FIG. 5A and FIG. 5B are schematic partially enlarged views of dotted boxes A and B in FIG. 4, respectively.
Figure 5B:
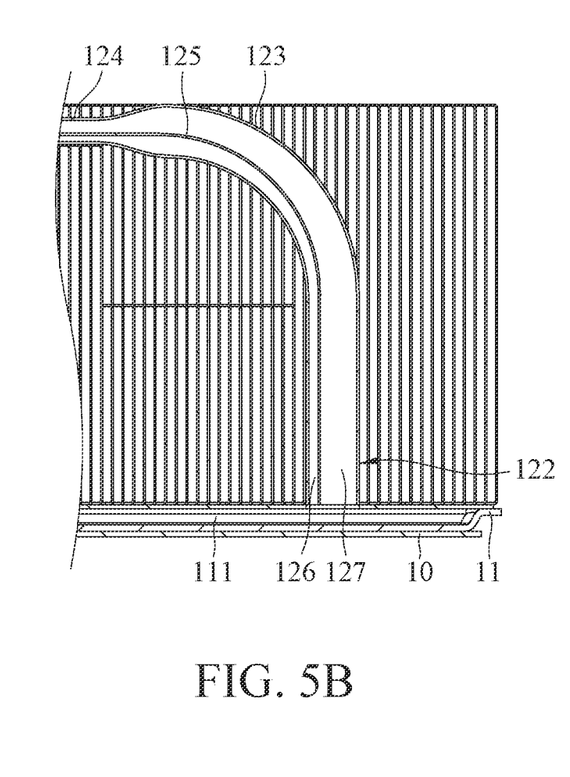

In an embodiment, the heat dissipation device 1 further includes a base 10 on which the vapor chamber 11 can be disposed. The vapor chamber 11 further includes a heat absorbing portion 112 protruding from a surface thereof that is in contact with the base 10, and the base 10 has an opening 101 for exposing the heat absorbing portion 112 at a position corresponding to the heat absorbing portion 112, so that the heat absorbing portion 112 can pass through the opening 101 and directly contact the heat source when the vapor chamber 11 is placed on the base 10.

When the present disclosure is applied, the heat dissipation device 1 can be applied to the case where the heat source is the processor 2. At this time, the base 10 can be disposed on a circuit board 3 around the processor 2 via a plurality of locking members 14 and two fasteners 15, so that the processor 2 directly contacts the heat absorbing portion 112. For instance, the base 10 may have a plurality of vias 102, the vapor chamber 11 may have a plurality of through holes 113 respectively corresponding to the plurality of vias 102, and each fastener 15 may have two locking holes 151. During assembly, the locking member 14 can pass through the locking hole 151, the through hole 113 and the via 102 in sequence, and then be locked to the corresponding screw hole (not shown) on the circuit board 3. In one embodiment, the locking member 14 may include a threaded member 141, and a washer 142 and an O-ring 143 sequentially passed through the threaded member 141. Further, there can be four locking members 14 and each of the locking members 14 is respectively arranged at each of the four corners of the processor 2, and the number of the vias 102, the through holes 113 and the locking holes 151 is also four, but the present disclosure does not limit the quantity and positions of the vias 102, the through holes 113, the locking holes 151 and the locking members 14.

When the heat dissipation device 1 of the present disclosure is in operation, the liquid working medium in the chamber 111 can absorb the heat of the heat source and then gasify into a gaseous working medium, and the gaseous working medium can enter the heat pipe 12 from the first channel 126 at the first end 121 and the second channel 127 at the second end 122, and gradually fill the entire heat pipe 12. At this time, the heat dissipation fin set 13 can condense the gaseous working medium in the heat pipe 12, so that the gaseous working medium is liquefied into a liquid working medium, and the liquid working medium in the heat pipe 12 can flow back into the chamber 111 from the second channel 127 at the first end 121 and the first channel 126 at the second end 122 to perform the next heat dissipating cycle. Since the first channel 126 has a radial cross-sectional area gradually decreasing from the first end 121 to the second end 122, and the second channel 127 has a radial cross-sectional area gradually decreasing from the second end 122 to the first end 121, this means that the gaseous working medium in the chamber 111 enters the heat pipe 12 via the end with a larger radial cross-sectional area in the first channel 126 and the second channel 127, and the liquid working medium in the heat pipe 12 flows back to the chamber 111 via the end with a smaller radial cross-sectional area in the first channel 126 and the second channel 127. This design will effectively allow the gaseous working medium in the chamber 111 to enter the heat pipe 12 more easily. Moreover, when the liquid working medium flows back into the chamber 111, it can be pressurized and sprayed into the chamber 111 because the radial cross-sectional areas of the first channel 126 and the second channel 127 are getting smaller and smaller, so that no backflow effect will occur. At the same time, the gaseous working medium in the chamber 111 can be prevented from flowing into the second channel 127 of the first end 121 and the first channel 126 of the second end 122.

By virtue of the heat dissipation device of the present disclosure comprising the vapor chamber, the heat pipes, the partitions and the heat dissipation fin sets, when faced with a large amount of heat energy generated by a high-power processor, the vapor chamber in the heat dissipation device of the present disclosure can efficiently absorb heat energy, and allow the gaseous working medium to enter the heat pipe more easily, so that the heat pipe and the heat dissipation fin set can dissipate heat efficiently. In addition, the partition of the present disclosure can divide the heat pipe into two channels at the same time, so that via the arrangement of the radial cross-sectional areas of the two channels gradually decreasing in opposite directions, the working medium in the channel is converted from the gaseous state to the liquid state in a single direction (that is, the direction in which the radial cross-sectional area of the channel becomes smaller), without being disturbed by other interferences to generate backflow. Therefore, the heat dissipation device of the present disclosure can provide higher heat dissipation efficiency as a whole, and can maintain effective and consistent heat dissipation.

The foregoing embodiments are provided for the purpose of illustrating the principles, features and effects of the present disclosure, rather than limiting the present disclosure. Anyone skilled in the art can modify and alter the above embodiments without departing from the spirit and scope of the present disclosure. However, any equivalent modifications and changes accomplished by using the teachings of the present disclosure should still be covered by the scope of the following claims. Therefore, the scope of protection with regard to the present disclosure should be as defined in the accompanying claims listed below.

What is claimed is:

1. A heat dissipation device, comprising:
   a vapor chamber in contact with a heat source and having a chamber formed in the vapor chamber;
   at least one heat pipe having a first end and a second end, wherein the first end and the second end are communicated with the vapor chamber;
   at least one partition disposed in the at least one heat pipe and partitioning an inside of the at least one heat pipe into a first channel and a second channel isolated from each other; and
   a heat dissipation fin set disposed on the vapor chamber and partially covering the at least one heat pipe,
   wherein the chamber is filled with a liquid working medium, and the liquid working medium absorbs heat of the heat source and then gasifies into a gaseous working medium, and the gaseous working medium moves into the first channel and the second channel to be condensed by the heat dissipation fin set, such that the gaseous working medium is liquefied into the liquid working medium, and then the liquid working medium flows back into the chamber,
   wherein space of the first channel at the first end is larger than space of the second channel at the first end, and space of the first channel at the second end is smaller than space of the second channel at the second end.

2. The heat dissipation device of claim 1, wherein the gaseous working medium in the chamber enters the at least one heat pipe from the first channel at the first end and the second channel at the second end, and the liquid working medium in the at least one heat pipe enters the chamber from the second channel at the first end and the first channel at the second end.

3. The heat dissipation device of claim 1, wherein the first channel has a radial cross-sectional area gradually decreasing from the first end to the second end, and the second channel has a radial cross-sectional area gradually decreasing from the second end to the first end.

4. The heat dissipation device of claim 1, wherein the at least one heat pipe comprises two bent portions and a middle portion, and the two bent portions are respectively erected on the vapor chamber and ends of the two bent portions are bent, and two ends of the middle portion are respectively connected to the ends of the two bent portions, such that the middle portion is disposed between the two bent portions.

5. The heat dissipation device of claim 4, wherein the heat dissipation fin set comprises a first fin set and two second fin sets, the two second fin sets are respectively disposed at two ends of the vapor chamber and respectively have at least one recess for accommodating the two bent portions, and the first fin set is disposed between the two second fin sets and corresponding to a position of the middle portion.

6. The heat dissipation device of claim 5, wherein fin heights of the two second fin sets are higher than fin heights of the first fin set.

7. The heat dissipation device of claim 5, wherein the middle portion is disposed above the first fin set and superficially attached to a top of the first fin set.

8. The heat dissipation device of claim 5, wherein a portion of the at least one partition located in the middle portion is closer to a top of the first fin set and parallel to the middle portion, such that space of the first channel at the middle portion is smaller than space of the second channel at the middle portion.

9. The heat dissipation device of claim 5, wherein an extending direction of fins of the first fin set and the two second fin sets is perpendicular to an extending direction of the middle portion.

10. The heat dissipation device of claim 5, wherein a number of the at least one heat pipe is two and the two heat pipes are parallel to each other, a number of the at least one partition is two, and a number of the at least one recess in each of the two second fin sets is two.

11. The heat dissipation device of claim 4, wherein a cross-sectional shape of the middle portion comprises rectangle, square, triangle, trapezoid, circle, or semicircle.

12. The heat dissipation device of claim 1, further comprising a base on which the vapor chamber is disposed, the base having an opening, wherein the vapor chamber further comprises a heat absorbing portion protruding from the opening and in direct contact with the heat source.

13. The heat dissipation device of claim 12, wherein the heat source is a processor, and the base and the vapor chamber are disposed on a circuit board around the processor via a plurality of locking members and two fasteners, such that the processor is in direct contact with the heat absorbing portion.

14. The heat dissipation device of claim 1, wherein the at least one partition is in a shape of a flat plate.

15. The heat dissipation device of claim 1, wherein the at least one heat pipe has the same material as the at least one partition and is integrally formed with the at least one partition.

* * * * *